United States Patent
Chen et al.

(10) Patent No.: US 10,937,724 B2
(45) Date of Patent: Mar. 2, 2021

(54) PACKAGE STRUCTURE APPLIED TO DRIVING APPARATUS OF DISPLAY

(71) Applicant: Raydium Semiconductor Corporation, Hsinchu (TW)

(72) Inventors: Ching-Yung Chen, Taoyuan (TW); Wen-Tsung Lin, Tainan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 40 days.

(21) Appl. No.: 16/386,533

(22) Filed: Apr. 17, 2019

(65) Prior Publication Data
US 2019/0348358 A1 Nov. 14, 2019

Related U.S. Application Data

(60) Provisional application No. 62/670,053, filed on May 11, 2018.

(51) Int. Cl.
*H05K 1/00* (2006.01)
*H01L 23/498* (2006.01)
*H01L 21/677* (2006.01)

(52) U.S. Cl.
CPC .... *H01L 23/49838* (2013.01); *H01L 23/4985* (2013.01); *H01L 21/67706* (2013.01)

(58) Field of Classification Search
CPC ........... H01L 23/49838; H01L 23/4985; H01L 21/67706; H01L 23/5387; H01L 24/50; H01L 25/0655
See application file for complete search history.

(56) References Cited

U.S. PATENT DOCUMENTS

| | | | | |
|---|---|---|---|---|
| 5,737,272 A * | 4/1998 | Uchiyama | ........... | G02F 1/13452 345/206 |
| 9,241,407 B2 * | 1/2016 | Ha | ..................... | H01L 23/49524 |
| 10,020,280 B2 * | 7/2018 | Hong | ...................... | H01L 24/86 |
| 10,699,974 B2 * | 6/2020 | Lim | ..................... | H01L 23/4985 |
| 2007/0063951 A1 * | 3/2007 | Lin | ...................... | G09G 3/3685 345/93 |
| 2015/0253618 A1 * | 9/2015 | Chen | ................... | G02F 1/13452 327/564 |

* cited by examiner

*Primary Examiner* — Yuriy Semenenko

(57) ABSTRACT

A package structure applied to a driving apparatus of a display is disclosed. The driving apparatus includes at least one driving unit. The package structure includes a substrate, a first connecting unit, a second connecting unit and at least one package unit. The substrate is used to carry the driving unit. The first connecting unit is disposed at one side of the substrate. A longitudinal direction of the first connecting unit is parallel to a first direction. The second connecting unit is disposed at the other side of the substrate. A longitudinal direction of the second connecting unit is parallel to the first direction. The package unit is used to package the driving unit to form driving unit package object. A longitudinal direction of the driving unit package object is parallel to a second direction. The first direction and the second direction are perpendicular to each other.

12 Claims, 6 Drawing Sheets

PACKAGE STRUCTURE APPLIED TO DRIVING APPARATUS OF DISPLAY

BACKGROUND OF THE INVENTION

1. Field of the Invention

The invention relates to package; in particular, to a package structure applied to a driving apparatus of a display.

2. Description of the Prior Art

As shown in FIG. 1, in the conventional chip-on-film (COF) structure, the longitudinal direction of the wafer (for example, the second direction DL) may be only perpendicular to the moving direction (for example, the first direction DD) of the sprocket hole SH due to the limitation of the production equipment.

However, the above limitations may result in the width of the existing COF package structure being limited by the maximum effective width obtained by subtracting the range of the sprocket hole SH from the bandwidth of the transmission belt. For example, if the standard bandwidth of the transmission belt is 35 mm/48 mm/70 mm, the maximum effective width after subtracting the range of the sprocket hole SH is 29 mm/42.5 mm/63 mm respectively.

In addition, under the limitation of the maximum effective width, no matter the COF package structure P having a high number of output channels (for example, 1440 output channels) in FIG. 2, the COF package structures P1~P2 having a lower number of output channels (for example, 720 output channels) in FIG. 3A or the COF package structures having a lower number of output channels (for example, 480 output channels) in FIG. 3B, the number of chips can be placed and the spacing of the chips are limited, and the yield and the maximum number of output channels of outer lead bonding (OLB) cannot be increased.

Therefore, the above problems encountered in the conventional COF package structure are still in need of further improvement.

SUMMARY OF THE INVENTION

Therefore, the invention provides a package structure applied to a driving apparatus of a display to solve the above-mentioned problems of the prior arts.

A preferred embodiment of the invention is a package structure applied to a driving apparatus of a display. In this embodiment, the driving apparatus includes at least one driving unit. The package structure includes a substrate, a first connecting unit, a second connecting unit and at least one package unit. The substrate is configured to carry the at least one driving unit. The first connecting unit is disposed at a side of the substrate, wherein a longitudinal direction of the first connecting unit is parallel to a first direction. The second connecting unit is disposed at another side of the substrate, wherein a longitudinal direction of the second connecting unit is parallel to the first direction. The at least one package unit is configured to package the at least one driving unit to form at least one driving unit package object, wherein a longitudinal direction of the at least one driving unit package object is parallel to a second direction. The first direction and the second direction are perpendicular to each other.

In an embodiment, the package structure is a chip on film (COF) structure.

In an embodiment, the first connecting unit and the second connecting unit are coupled to a printed circuit board and a display panel respectively.

In an embodiment, the package structure is carried by a belt, and a moving direction of the belt is parallel to the first direction.

In an embodiment, a width direction of the at least one driving unit package object is parallel to the first direction, so that a width and a pitch of the at least one driving unit package object in the first direction has nothing to do with a width of the belt in the second direction.

In an embodiment, each driving unit package object is coupled to the first connecting unit and the second connecting unit through its input channels and output channels respectively.

In an embodiment, a total number of input channels of the driving apparatus equals to a sum of input channel numbers of all driving units.

In an embodiment, a total number of output channels of the driving apparatus equals to a sum of output channel numbers of all driving units.

In an embodiment, the at least one driving unit is a plurality of driving units providing different functions respectively.

In an embodiment, the at least one driving unit is a plurality of driving units spaced the same distance from each other.

In an embodiment, the at least one driving unit is a plurality of driving units spaced different distances from each other.

In an embodiment, the driving apparatus is a source driver.

Compared to the prior art, since the longitudinal direction of the input connecting unit and the output connecting unit is perpendicular to the longitudinal direction of the driving unit package object in the driving apparatus package structure applied to the display of the invention, the width and the pitch of the driving unit package object are independent of the width of the transmission belt. Therefore, the width of the COF package structure of the invention is not limited by the maximum effective width of the transmission belt, so that the number of chips that can be placed in the COF package structure and the chip pitch are not limited, thereby the yield and the maximum output channel number of outer pin bonding (OLB) can be increased, and the difference between the longest path and the shortest path is not too large, and the original process can be maintained without change to avoid increasing process complexity and cost.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

A preferred embodiment of the invention is a package structure. In this embodiment, the package structure is used to package a driving apparatus of a display, such as to package a source driver of a display, but not limited to this.

In order to effectively improve the disadvantage that the width of the COF package structure in the prior art is limited by the maximum effective width of the transmission belt, in the package structure of the invention, the longitudinal direction of the input connecting unit and the output connecting unit will be perpendicular to the width direction of the transmission belt instead of being parallel to the width direction of the transmission belt in the prior art, so that the longitudinal direction of the input connecting unit and the output connecting unit is changed to be perpendicular to the longitudinal direction of the driving unit package object. Therefore, the width and pitch of the driving unit package object of the invention are only related to the length of the transmission belt and independent of the width of the transmission belt, and thus not limited by the maximum effective width of the transmission belt in the prior art.

Figure 1:
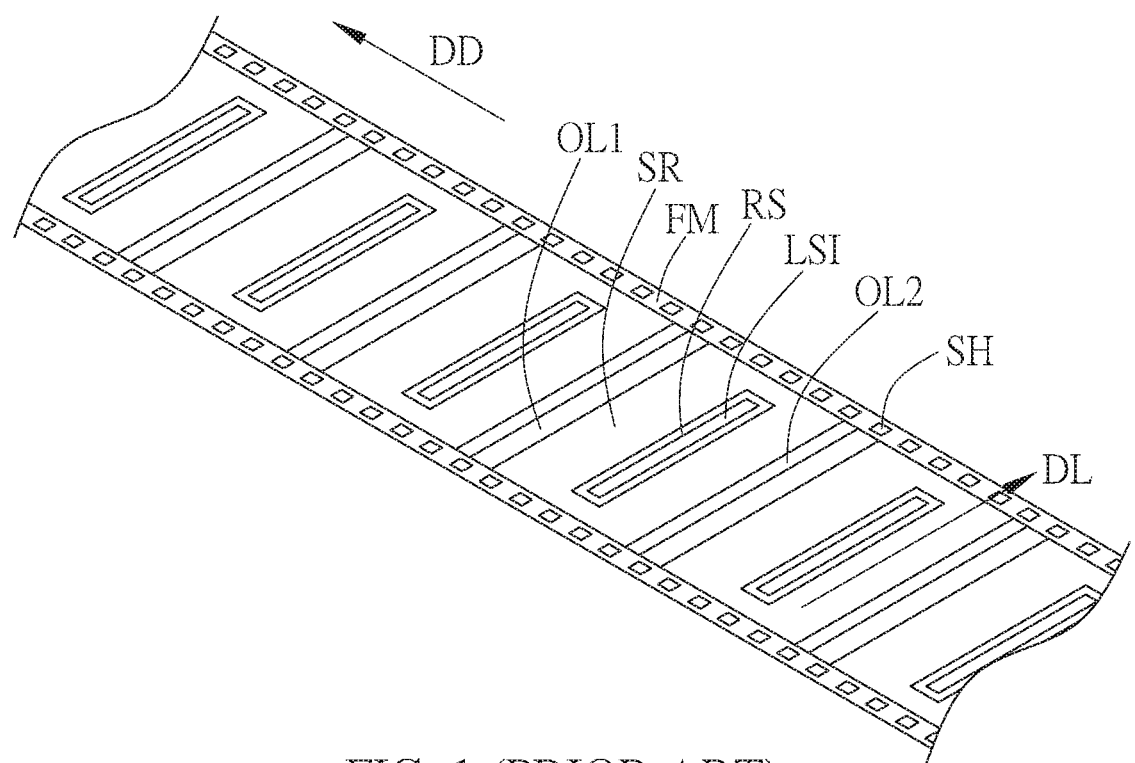
FIG. 1 illustrates a schematic diagram of the width of the conventional COF package structure being limited by the maximum effective width of the transmission belt.
Figure 2:
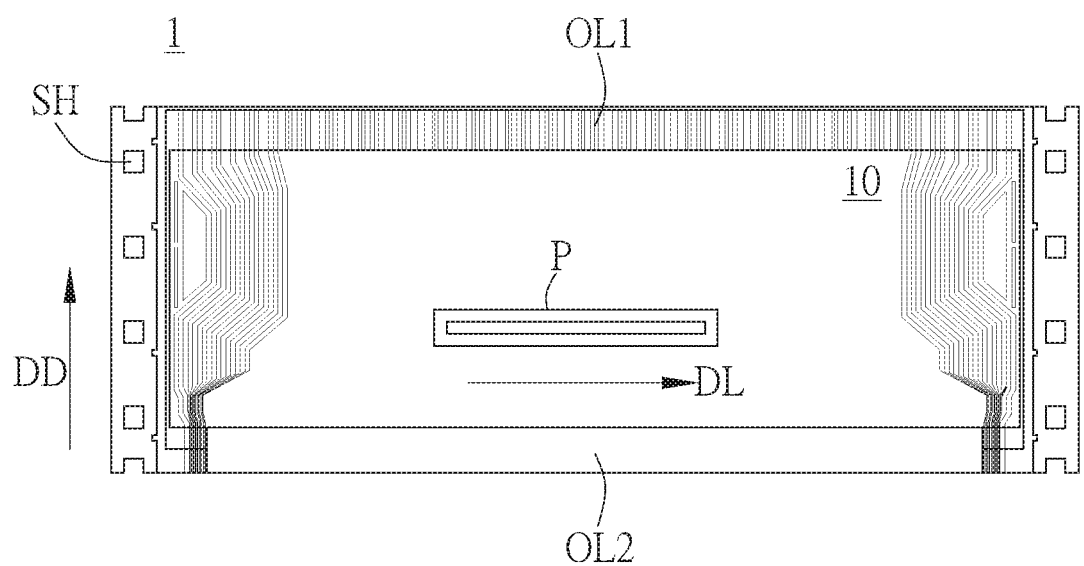
FIG. 2 illustrates a schematic diagram of the conventional one COF package structure having a high number of output channels.
Figure 3A:
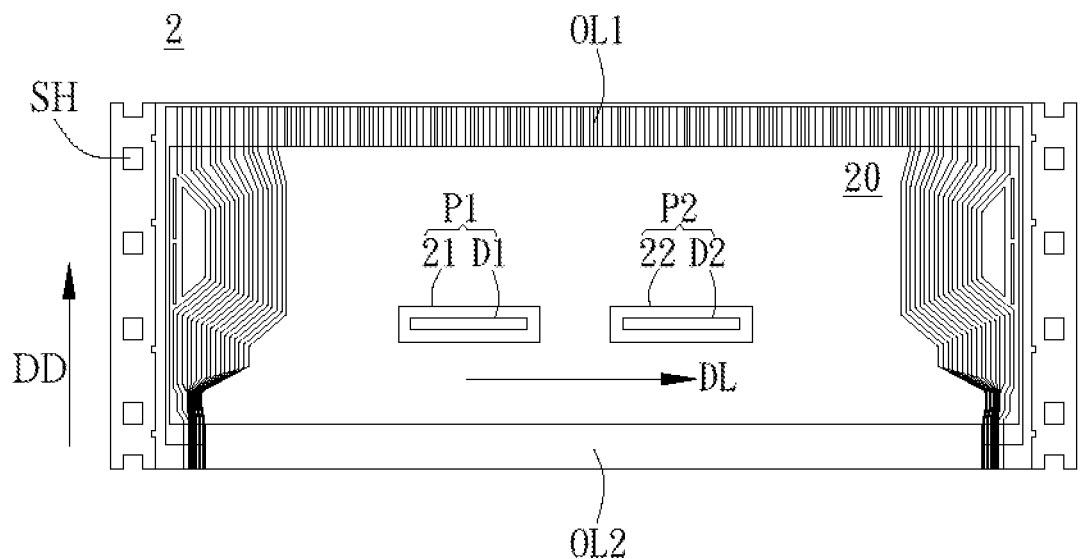
FIG. 3A illustrates a schematic diagram of the conventional two COF package structures having a lower number of output channels.
Figure 3B:
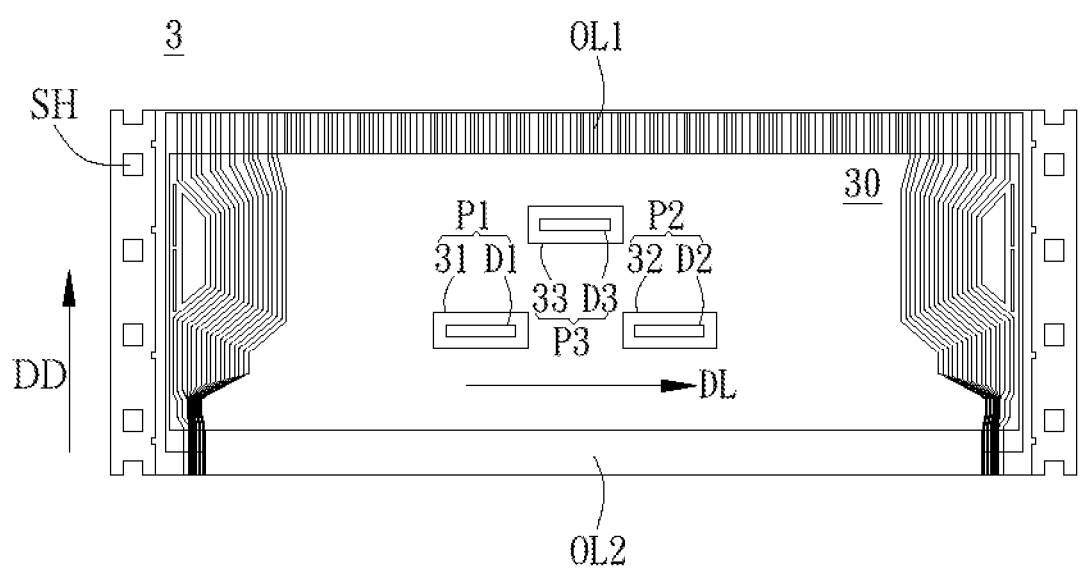
FIG. 3B illustrates a schematic diagram of the conventional three COF package structures having a lower number of output channels.
Figure 4:
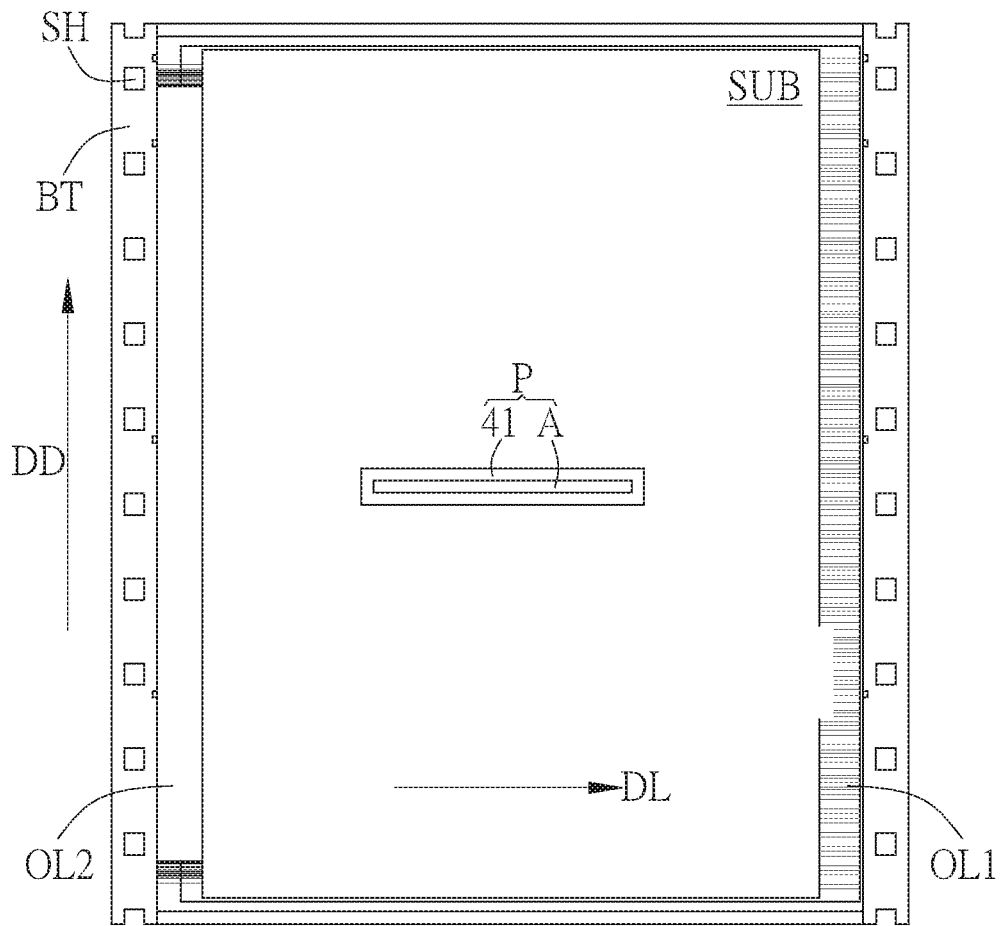
FIG. 4 illustrates a schematic diagram of the package structure applied to the driving apparatus of the display in an embodiment of the invention.

Please refer to FIG. 4. FIG. 4 illustrates a schematic diagram of the package structure applied to the driving apparatus of the display in this embodiment.

It should be noted that the package structure 4 of this embodiment is a COF package structure and it only includes a driving unit package object P of a single driving unit A. For example, the driving unit A can be a single driving chip having a high output channel number (for example, 1440 output channels), but not limited to this.

As shown in FIG. 4, the package structure 4 includes a substrate SUB, a first connecting unit OL1, a second connecting unit OL2 and a package unit 41. The substrate SUB is used to carry the driving unit A. The first connecting unit OL1 is disposed at one side of the substrate SUB and the second connecting unit OL2 is disposed at another side of the substrate SUB; that is to say, the first connecting unit OL1 and the second connecting unit OL2 are opposed to each other. The package unit 41 is used to package the driving unit A to form the driving unit package object P.

The longitudinal direction of the first connecting unit OL1 and the longitudinal direction of the second connecting unit OL2 are both parallel to the first direction DD. The longitudinal direction of the driving unit package object P is parallel to the second direction DL, and the second direction DL and the first direction DD are perpendicular to each other. That is to say, the longitudinal direction of the driving unit package object P is perpendicular to the longitudinal direction of the first connecting unit OL1 and the second connecting unit OL2.

When the package structure 4 of this embodiment is carried by the transmission belt BT, the moving direction of the sprocket hole SH on the transmission belt BT (that is, the transmission direction of the transmission belt BT) is parallel to the first direction DD, and the width direction of the transmission belt BT is parallel to the second direction DL.

It can be seen from the above that in the package structure 4 of the embodiment, the longitudinal direction (e.g., the first direction DD) of the first connecting unit OL1 and the second connecting unit OL2 is perpendicular to the width direction (e.g., the second direction DL) of the transmission belt and the longitudinal direction (e.g., the second direction DL) of the driving unit package object P, so that the width and pitch of the driving unit package object P are only related to the length of the transmission belt and independent of the width of the transmission belt, so it is not limited to the maximum effective width of the transmission belt. Therefore, the number and pitch of the driving unit package objects that can be placed in the package structure 4 of this embodiment are not particularly limited as long as the length of the transmission belt is long enough.

In the actual application, the first connecting unit OL1 and the second connecting unit OL2 can be an input connecting unit and an output connecting unit respectively, which are coupled to the printed circuit board and the display panel respectively, but not limited to this.

Figure 5:
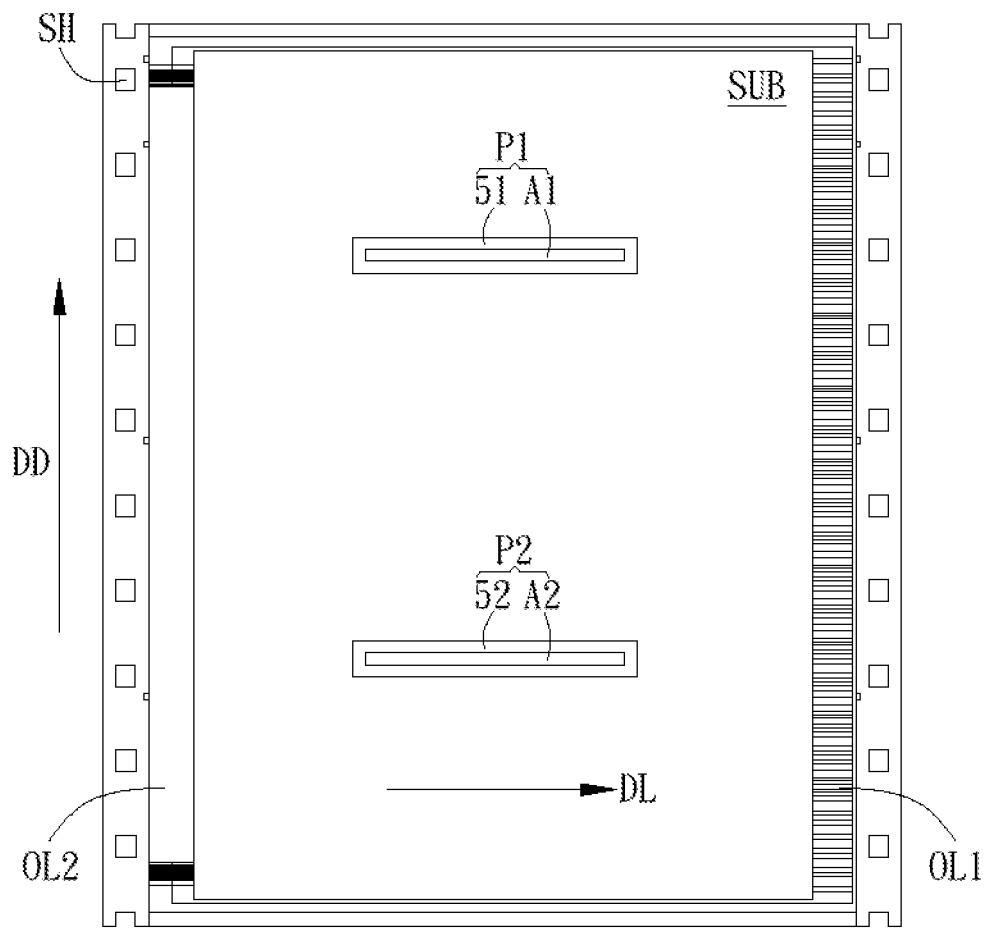
FIG. 5 illustrates a schematic diagram of the package structure applied to the driving apparatus of the display in another embodiment of the invention.

Next, please refer to FIG. 5. FIG. 5 illustrates a schematic diagram of the package structure 5 applied to the driving apparatus of the display according to another embodiment of the invention.

It should be noted that the package structure 5 in this embodiment is a chip-on-film (COF) package structure and includes a first driving unit package object P1 of the first driving unit A1 and a second driving unit package object P2 of the second driving unit A2. For example, the first driving unit A1 and the second driving unit A2 can be two driving chips having a lower number of output channels (for example, 720 output channels) respectively, but not limited to this. In addition, the first driving unit A1 and the second driving unit A2 can be driving chips having different functions, but not limited to this.

As shown in FIG. 5, the package structure 5 of this embodiment includes a substrate SUB, a first connecting unit OL1, a second connecting unit OL2, a first package unit 51 and a second package unit 52. The substrate SUB is configured to carry the first driving unit A1 and the second driving unit A2 separated from each other. The first connecting unit OL1 is disposed at one side of the substrate SUB and the second connecting unit OL2 is disposed at another side of the substrate SUB; that is to say, the first connecting unit OL1 and the second connecting unit OL2 are opposed to each other. The first package unit 51 is configured to package the first driving unit A1 to form the first driving unit package object P1. The second package unit 52 is configured to package the second driving unit A2 to form the second driving unit package object P2.

The longitudinal direction of the first connecting unit OL1 and the longitudinal direction of the second connecting unit OL2 are both parallel to the first direction DD. The longitudinal direction of the first driving unit package object P1 and the longitudinal direction of the second driving unit package object P2 are both parallel to the second direction DL, and the second direction DL and the first direction DD are perpendicular to each other. That is to say, the longitudinal direction of the first driving unit package object P1 and the second driving unit package object P2 is perpendicular to the longitudinal direction of the first connecting unit OL1 and the second connecting unit OL2.

When the package structure 5 of this embodiment is carried by the transmission belt, the moving direction of the sprocket hole SH on the transmission belt (that is, the longitudinal direction of the transmission belt) is parallel to the first direction DD, and the width direction of the transmission belt is parallel to the second direction DL.

It can be seen from the above that in the package structure 5 of this embodiment, the longitudinal direction (e.g., the first direction DD) of the first connecting unit OL1 and the second connecting unit OL2 is perpendicular to the width direction of the transmission belt (e.g., the second direction DL) and the longitudinal direction of the first driving unit package object P1 and the second driving unit package object P2 (e.g., the second direction DL), so that the width and the pitch of the first driving unit package object P1 and the second driving unit package object P2 are only related to the length of the transmission belt and independent of the width of the transmission belt, so it is not limited by the maximum effective width of the transmission belt. Therefore, as long as the length of the transmission belt is long enough, the number and pitch of the driving unit package objects can be placed in the package structure 5 of this embodiment are not particularly limited.

Figure 6:
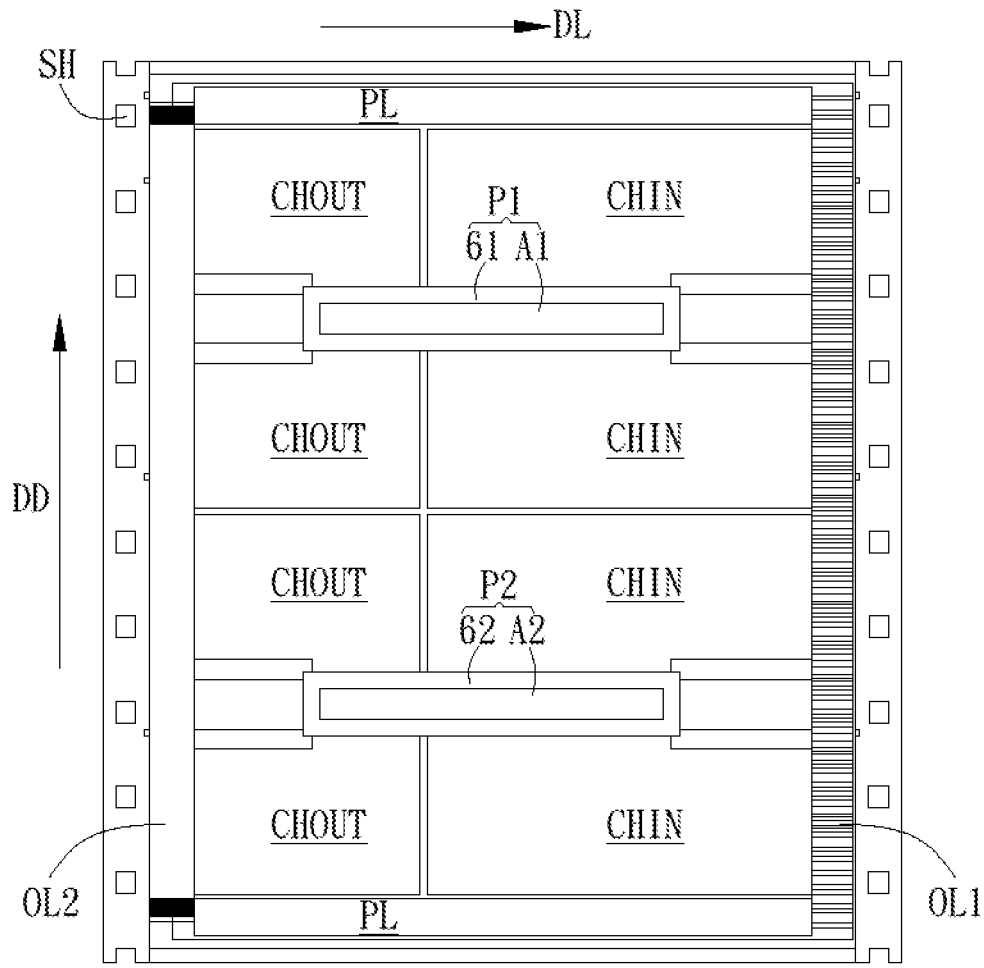
FIG. 6 illustrates a schematic diagram of the first driving unit package object and the second driving unit package object being coupled to the first connecting unit and the second connecting unit through the input channel and the output channel respectively.

Then, as shown in FIG. 6, in the package structure 6, the first driving unit A1 in the first driving unit package object P1 and the second driving unit A2 in the second driving unit package object P2 can be coupled to the first connecting unit OL1 and the second connecting unit OL2 through the input channels CHIN and the output channels CHOUT respectively. In the practical applications, the first connecting unit OL1 and the second connecting unit OL2 can be an input connecting unit and an output connecting unit respectively, which are coupled to the printed circuit board and the display panel respectively, but not limited to this.

It should be noted that the total input channel number of the driving apparatus will be equal to the sum of the respective input channel numbers of all driving units and the total output channel number of the driving apparatus will be equal to the sum of the respective output channel numbers of all driving units. For example, if the number of input channels of the first driving unit A1 and the number of input channels of the second driving unit A2 in FIG. 6 are both 600, the total input channel number of the driving apparatus will be equal to 1200; if the number of output channels of the first driving unit A1 and the number of input channels of the second driving unit A2 are both 720, the total number of output channels of the driving device is equal to 1,440, but not limited to this.

Figure 7:
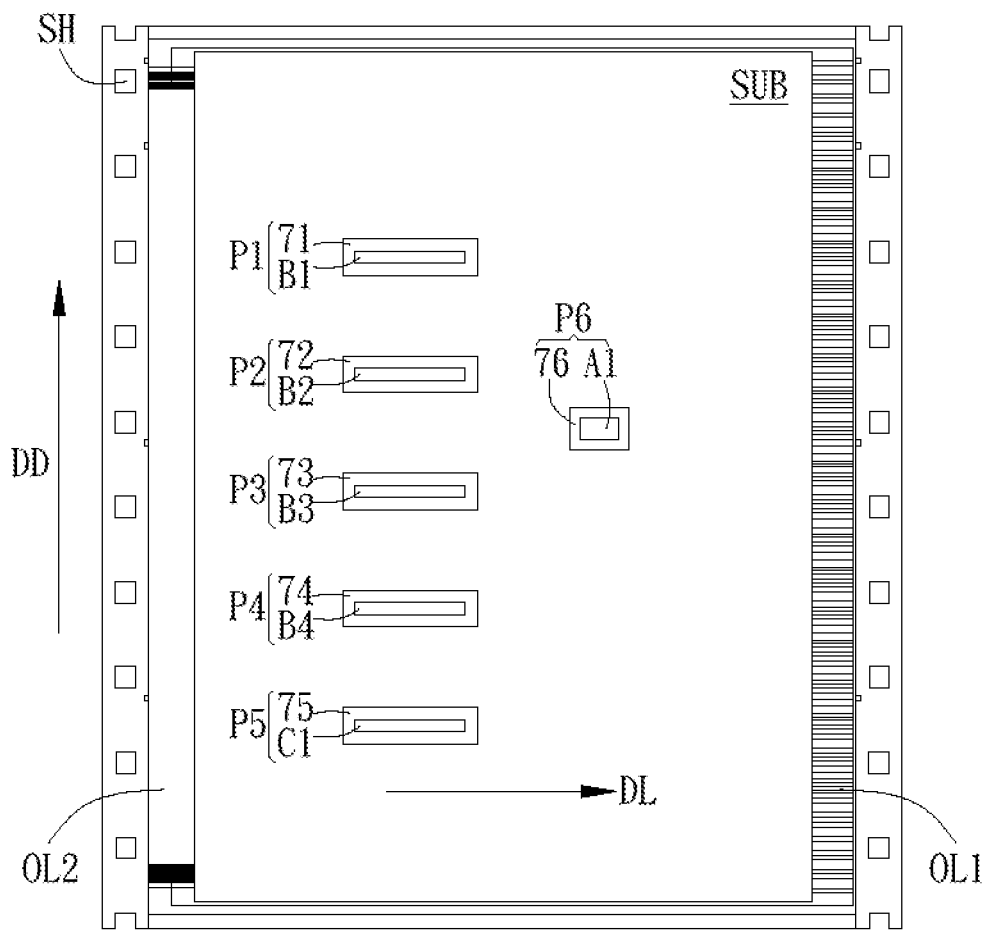
FIG. 7 illustrates a schematic diagram that the number of driving units can be placed in the package structure of the invention and the driving unit pitch are not limited by the maximum effective width of the transmission belt and each driving unit can have different functions.

Next, please refer to FIG. 7. FIG. 7 illustrates a schematic diagram that the number of driving units can be placed in the package structure 7 of the invention and the driving unit pitch are not limited by the maximum effective width of the transmission belt, and each driving unit can have different functions.

As shown in FIG. 7, the package structure 7 of this embodiment includes a substrate SUB, a first connecting unit OL1, a second connecting unit OL2, a first package unit 71, a second package unit 72, a third package unit 73 and a fourth package unit 74, a fifth package unit 75 and a sixth package unit 76. The substrate SUB is used to carry a plurality of driving units A1, B1~B4 and C1 separated from each other.

It should be noted that the plurality of driving units A1, B1~B4 and C1 can provide different functions respectively; for example, the driving unit A1 can be used to provide the first function, the driving units B1~B4 can be used to provide the second function and the driving unit C1 can be used to provide a third function, but not limited to this.

In addition, the plurality of driving units A1, B1~B4, and C1 can be spaced apart from each other by the same distance or by different distances, and the plurality of driving units A1, B1~B4 and C1 can have the same size or different sizes depending on actual needs without specific restrictions.

In this embodiment, the first connecting unit OL1 is disposed at one side of the substrate SUB and the second connecting unit OL2 is disposed at another side of the substrate SUB; that is to say, the first connecting unit OL1 and the second connecting unit OL2 are opposed to each other. The first package unit 71 is used to package the driving unit B1 to form the first driving unit package object P1. The second package unit 72 is configured to package the driving unit B2 to form the second driving unit package object P2. The third package unit 73 is configured to package the driving unit B3 to form the third driving unit package object P3. The fourth package unit 74 is used to package the driving unit B4 to form the fourth driving unit package object P4. The fifth package unit 75 is used to package the driving unit C1 to form a fifth driving unit package object P5. The sixth package unit 76 is used to package the driving unit A1 to form a sixth driving unit package object P6.

It should be noted that the longitudinal direction of the first connecting unit OL1 and the longitudinal direction of the second connecting unit OL2 are both parallel to the first direction DD. The longitudinal directions of the first driving unit package object P1~the sixth driving unit package object P6 are all parallel to the second direction DL, and the second direction DL and the first direction DD are perpendicular to each other. That is to say, the longitudinal directions of the first driving unit package object P1~the sixth driving unit package object P6 are perpendicular to the longitudinal direction of the first connecting unit OL1 and the longitudinal direction of the second connecting unit OL2.

When the package structure 7 of this embodiment is carried by the transmission belt, the moving direction of the sprocket hole SH on the transmission belt (that is, the longitudinal direction of the transmission belt) is parallel to the first direction DD, and the width direction of the transmission belt is parallel to the second direction DL.

It can be seen from the above that the longitudinal direction (e.g., the first direction DD) of the first connecting unit OL1 and the second connecting unit OL2 in the invention is perpendicular to the width direction of the transmission belt (e.g., the second direction DL) and the longitudinal direction (e.g., the second direction DL) of the first driving unit package object P1~the sixth driving unit package object P6, so that the width and the pitch of the first driving unit package object P1~the sixth driving unit package object P6 are only related to the length of the transmission belt and independent from the width of the transmission belt, so it is not limited by the maximum effective width of the transmission belt. Therefore, as long as the length of the transmission belt is long enough, the number of the driving unit package objects can be placed in the package structure 7 of this embodiment and the pitch driving unit package object are not particularly limited.

Compared to the prior art, since the longitudinal direction of the input connecting unit and the output connecting unit is perpendicular to the longitudinal direction of the driving unit package object in the driving apparatus package structure applied to the display of the invention, the width and the pitch of the driving unit package object are independent of the width of the transmission belt. Therefore, the width of the COF package structure of the invention is not limited by the maximum effective width of the transmission belt, so that the number of chips that can be placed in the COF package structure and the chip pitch are not limited, thereby the yield and the maximum output channel number of outer pin bonding (OLB) can be increased, and the difference between the longest path and the shortest path is not too large, and the original process can be maintained without change to avoid increasing process complexity and cost.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A package structure applied to a driving apparatus of a display, the driving apparatus comprising at least one driving unit, the package structure comprising:
    a substrate, configured to carry the at least one driving unit; and
    a first connecting unit, disposed at a side of the substrate, wherein a longitudinal direction of the first connecting unit is parallel to a first direction;
    a second connecting unit, disposed at another side of the substrate, wherein a longitudinal direction of the second connecting unit is parallel to the first direction; and
    at least one package unit, configured to package the at least one driving unit to form at least one driving unit package object, wherein a longitudinal direction of the at least one driving unit package object is parallel to a second direction;
    wherein the first direction and the second direction are perpendicular to each other; the at least one driving unit package object comprises a plurality of first driving unit package objects and a second driving unit package object the plurality of first driving unit package objects is disposed at the side of the substrate and arranged equally along the first direction; the second driving unit package object is disposed at the another side of the substrate.

2. The package structure of claim 1, wherein the package structure is a chip on film (COF) structure.

3. The package structure of claim 1, wherein the first connecting unit and the second connecting unit are coupled to a printed circuit board and a display panel.

4. The package structure of claim 1, wherein when the package structure is carried by a belt, and a moving direction of the belt is parallel to the first direction.

5. The package structure of claim 4, wherein a width direction of the at least one driving unit package object is parallel to the first direction, so that a width and a pitch of the at least one driving unit package object in the first direction has nothing to do with a width of the belt in the second direction.

6. The package structure of claim 1, wherein each driving unit package object is coupled to the first connecting unit and the second connecting unit through its input channels and output channels respectively.

7. The package structure of claim 1, wherein a total number of input channels of the driving apparatus equals to a sum of input channel numbers of all driving units.

8. The package structure of claim 1, wherein a total number of output channels of the driving apparatus equals to a sum of output channel numbers of all driving units.

9. The package structure of claim 1, wherein the at least one driving unit is a plurality of driving units providing different functions respectively.

10. The package structure of claim 1, wherein the at least one driving unit is a plurality of driving units spaced the same distance from each other.

11. The package structure of claim 1, wherein the at least one driving unit is a plurality of driving units spaced different distances from each other.

12. The package structure of claim 1, wherein the driving apparatus is a source driver.

* * * * *